(12) United States Patent
Li

(10) Patent No.: US 12,368,124 B2
(45) Date of Patent: Jul. 22, 2025

(54) METHOD FOR FORMING SEMICONDUCTOR PACKAGE AND SEMICONDUCTOR PACKAGE

(71) Applicant: Yibu Semiconductor Co., Ltd., Shanghai (CN)

(72) Inventor: Weiping Li, Shanghai (CN)

(73) Assignee: Yibu Semiconductor Co., Ltd., Shanghai (CN)

(*) Notice: Subject to any disclaimer, the term of this patent is extended or adjusted under 35 U.S.C. 154(b) by 282 days.

(21) Appl. No.: 17/535,988

(22) Filed: Nov. 26, 2021

(65) Prior Publication Data
US 2022/0173063 A1 Jun. 2, 2022

(30) Foreign Application Priority Data
Nov. 27, 2020 (CN) .......................... 202011359779.8

(51) Int. Cl.
*H01L 23/00* (2006.01)

(52) U.S. Cl.
CPC .............. *H01L 24/14* (2013.01); *H01L 24/06* (2013.01); *H01L 24/11* (2013.01);
(Continued)

(58) Field of Classification Search
CPC . H01L 24/14; H01L 24/06; H01L 2224/0401; H01L 2224/0603;
(Continued)

(56) References Cited

U.S. PATENT DOCUMENTS 8,294,265 B1\* 10/2012 Oh .......................... H01L 24/13
257/737
8,836,146 B2\* 9/2014 Chou ...................... H01L 24/11
257/E23.021

(Continued)

FOREIGN PATENT DOCUMENTS

CN 107104096 A 8/2017
CN 210296353 U 4/2020
(Continued)

OTHER PUBLICATIONS

Shanghai Yibu Semiconductor Co., Ltd., CN First Office Action, CN202011559083.X, Mar. 1, 2022, 10 pgs.
(Continued)

*Primary Examiner* — Kretelia Graham
*Assistant Examiner* — Jaesun Lee
(74) *Attorney, Agent, or Firm* — USCH Law, PC

(57) ABSTRACT

The present disclosure provides a method for forming a semiconductor package and a semiconductor package. The method comprises providing a semiconductor wafer with at least one semiconductor device formed thereon, the at least one semiconductor device comprising a plurality of metal bond pads formed on the semiconductor wafer. The method further comprises forming a first photoresist layer having a first opening directly above at least a portion of a first metal bond pad; forming a first metal feature of a first height in the first opening; removing the first photoresist layer; forming a second photoresist layer having a second opening directly above at least a portion of the second metal bond pad; forming a second metal feature of a second height in the second opening; and removing the second photoresist layer. Using the method, metal bumps having different heights and different sizes can be formed in a controlled manner.

14 Claims, 5 Drawing Sheets

(52) U.S. Cl.
CPC .............. *H01L 2224/0401* (2013.01); *H01L 2224/0603* (2013.01); *H01L 2224/1145* (2013.01); *H01L 2224/11472* (2013.01); *H01L 2224/1403* (2013.01)

(58) Field of Classification Search
CPC ... H01L 2224/1145; H01L 2224/11472; H01L 2224/1403
See application file for complete search history.

(56) References Cited

U.S. PATENT DOCUMENTS

| | | | |
|---|---|---|---|
| 9,391,036 B2* | 7/2016 | Matsumoto | H01L 24/05 |
| 9,679,860 B2* | 6/2017 | Obu | H01L 24/14 |
| 9,754,905 B1* | 9/2017 | Misra | H01L 24/11 |
| 10,535,608 B1 | 1/2020 | Rubin | |
| 2005/0167780 A1 | 8/2005 | Edelstein et al. | |
| 2006/0226527 A1* | 10/2006 | Hatano | H01L 23/5389 438/109 |
| 2007/0023919 A1 | 2/2007 | Lin | |
| 2007/0205520 A1 | 9/2007 | Chou | |
| 2008/0284048 A1 | 11/2008 | Kim et al. | |
| 2012/0196438 A1* | 8/2012 | Chu | H01L 24/11 438/666 |
| 2012/0241949 A1 | 9/2012 | Sasaki | |
| 2013/0147032 A1 | 6/2013 | Jeng | |
| 2014/0070408 A1* | 3/2014 | So | H01L 24/03 257/737 |
| 2016/0143139 A1 | 5/2016 | Sorimachi | |
| 2019/0115319 A1 | 4/2019 | Hiner | |
| 2019/0326245 A1* | 10/2019 | Baello | H01L 24/09 |
| 2020/0020634 A1 | 1/2020 | Tsai | |
| 2020/0020655 A1* | 1/2020 | Tsai | H01L 24/13 |
| 2021/0020605 A1 | 1/2021 | Hiner | |
| 2021/0249335 A1* | 8/2021 | Krutsch | H01L 23/3735 |
| 2021/0288025 A1* | 9/2021 | Arvin | H01L 23/5385 |
| 2022/0199539 A1 | 6/2022 | Karhade | |

FOREIGN PATENT DOCUMENTS

| | | |
|---|---|---|
| KR | 20060100263 A | 9/2006 |
| KR | 20170089746 A | 8/2017 |

OTHER PUBLICATIONS

Shanghai Yibu Semiconductor Co., Ltd., TW First Office Action and Search Report, TW110148251, Jun. 27, 2022, 19 pgs.
Shanghai Yibu Semiconductor Co., Ltd., First Office Action and Search Report, TW 110144183, Apr. 19, 2022, 6 pgs.
Shanghai Yibu Semiconductor Co., Ltd., Second Office Action, TW 110144183, Sep. 15, 2022, 6 pgs.
Shanghai Yibu Semiconductor Co., Ltd., First Office Action (English Translation), KR 10-2021-0164048, Nov. 6, 2023, 9 pgs.
Shanghai Yibu Semiconductor Co., Ltd., KR First Office Action (English Translation), KR10-2021-0171515, Dec. 3, 2021, 5 pgs.
Cu pillar bump development for the assembly of high-performance fine-pitch flip chips, LB Semiconductor Co., Ltd. (published on Jul. 2013).
Weiping Li, U.S. First Office Action, U.S. Appl. No. 17/562,936, Oct. 27, 2023.
Yibu Semiconductor (Shanghai) Co., Ltd., First Office Action, KR 10-2021-0171515, May 30, 2023, 6 pgs.
Yibu Semiconductor (Shanghai) Co., Ltd., English Translation of First Office Action, KR 10-2021-0171515, May 30, 2023, 5 pgs.
Yibu Semiconductor (Shanghai) Co., Ltd., Second Office Action, KR 10-2021-0171515, Dec. 20, 2023, 7 pgs.
Yibu Semiconductor (Shanghai) Co., Ltd., English Translation of Second Office Action, KR 10-2021-0171515, Dec. 20, 2023, 5 pgs.
Yibu Semiconductor (Shanghai) Co., Ltd., First Office Action, CN 202011359779.8, Apr. 19, 2021, 7 pgs.
Yibu Semiconductor (Shanghai) Co., Ltd., Second Office Action, CN 202011359779.8, Jul. 13, 2021, 4 pgs.
Weiping Li, U.S. Appl. No. 17/562,936, Response to Non-Final Office Action, Jan. 29, 2024.
Weiping Li, U.S. Appl. No. 17/562,936, Final Office Action, Feb. 26, 2024.

* cited by examiner

METHOD FOR FORMING SEMICONDUCTOR PACKAGE AND SEMICONDUCTOR PACKAGE

CROSS REFERENCE TO RELATED APPLICATIONS

This application claims the benefit of priority under the Paris Convention to Chinese Patent Application No. CN202011359779.8, filed Nov. 27, 2020, entitled "Method for Forming Semiconductor Package and Semiconductor Package," which is hereby incorporated by reference in its entirety.

FIELD OF THE INVENTION

The present application is related to the field of semiconductors, and particularly to a method for forming a semiconductor package and the semiconductor package.

BACKGROUND

This section is intended to provide a background or context for the embodiments described herein and the invention recited in the claims. The description in this section is not admitted to be prior art by its inclusion in this section.

In the field of semiconductor packaging, wafer bumps (wafer bumping) are usually formed to have a uniform size because it is difficult to control different heights or sizes of the bumps on the same wafer. For example, larger-sized bumps are usually plated faster than smaller-sized bumps in an electroplating process, resulting in non-uniformity of the bump heights and affecting the manufacturing yield of chips.

SUMMARY

In view of the above-described problems of the prior art, a method of forming a semiconductor package and a semiconductor package have been proposed, and the above-described problems can be solved according to some embodiments.

In some embodiments, a method of forming a semiconductor package comprises providing a semiconductor wafer having at least one semiconductor device formed thereon, the at least one semiconductor device including a plurality of metal bond pads positioned on the semiconductor wafer, the plurality of metal bond pads including a first metal bond pad and a second metal bond pad. The method further comprises: forming a seed layer over the at least one semiconductor device, the seed layer being electrically connected to each metal bond pad; forming a first photoresist layer over the seed layer; forming a first opening in the first photoresist layer to expose a first portion of the seed layer directly over at least a portion of the first metal bond pad, forming a first metal feature of a first height in the first opening; and removing the first photoresist layer. The method further comprises: forming a second photoresist layer over the seed layer after removing the first photoresist layer; forming a second opening in the second photoresist layer to expose a second portion of the seed layer directly over at least a portion of the second metal bond pad, forming a second metal feature of a second height in the second opening; and removing the second photoresist layer.

In some embodiments, the method further comprises, before forming the seed layer, forming a patterned passivation layer over the semiconductor wafer and the a plurality of metal bond pads, the passivation layer exposing at least a portion of each metal bond pad; the seed layer covering at least the exposed surface of each metal bond pad.

In some embodiments, after forming the patterned passivation layer and before forming the seed layer, the method further comprises forming a polymer layer over the passivation layer.

In some embodiments, the method further comprises: sputtering a metal material on the exposed surfaces of the polymer layer and the a plurality of metal bond pads to form the seed layer; and, after removing the second photoresist layer, etching away the exposed portions of the seed layer.

In some embodiments, the method further comprises: depositing a first photoresist layer of a first thickness over the seed layer, placing a first mask layer over the first photoresist layer for patterning the first photoresist layer to form a first opening; and depositing a second photoresist layer of a second thickness over the seed layer after removing the first photoresist layer, and placing a second mask layer over the second photoresist layer for patterning the second photoresist layer to form a second opening.

In some embodiments, the method further comprises, after removing the first photoresist layer, a second photoresist layer is formed over the seed layer that completely covers the first metal feature.

In some embodiments, the thicknesses of the first and second metal features are different.

In some embodiments, the first metal feature and the second metal feature are both under bump metallization.

In some embodiments, a semiconductor package is provided using the method described above.

In some embodiments, a semiconductor package comprises at least one semiconductor device having a plurality of metal bond pad and a plurality of metal features formed on respective ones of the plurality of metal bond pads. The plurality of metal bond pads including a first bond pad and a second bond pad. The plurality of metal features including a first metal feature of a first height and a second metal feature of a second height different from the first height. Each of the plurality of metal features includes a seed layer formed on a respective metal bond pad and electrically connected to the respective metal bond pad, an under-bump metallization (UMB) layer formed over the seed layer, and a solder bump formed over the UMB layer.

In some embodiments, further comprising: a passivation layer formed over the semiconductor wafer and the plurality of metal bond pads. In some embodiments, a patterned opening in the passivation layer exposes at least a portion of each metal bond pad; the seed layer covers at least the exposed surface of each metal bond pad.

In some embodiments, the at least one semiconductor device further includes a polymer layer formed on a surface of the passivation layer.

In some embodiments, the thicknesses of the UMB layers in the first and second metal features are different.

In some embodiments, the first height is less than the second height.

With the above packaging method, different bump heights can be achieved in a controllable manner for a plurality of metal features or components of different sizes on a semiconductor wafer, which is very valuable for ASICs and small chips that need to achieve high density interconnect routing in the same package.

It should be understood that the above description is an overview of the technical solutions described herein. In order to make the aforementioned and other objects, features and advantages of the technical solutions comprehensible, embodiments accompanied with figures are described in detail below.

BRIEF DESCRIPTION OF THE DRAWINGS

The advantages and benefits described herein, as well as other advantages and benefits, will be apparent to those of ordinary skill in the art upon reading the following detailed description of the exemplary embodiments. The drawings are only for purposes of illustrating exemplary embodiments and are not to be construed as limiting the invention. Also, like reference numerals are used to refer to like elements throughout.

Figure 1:
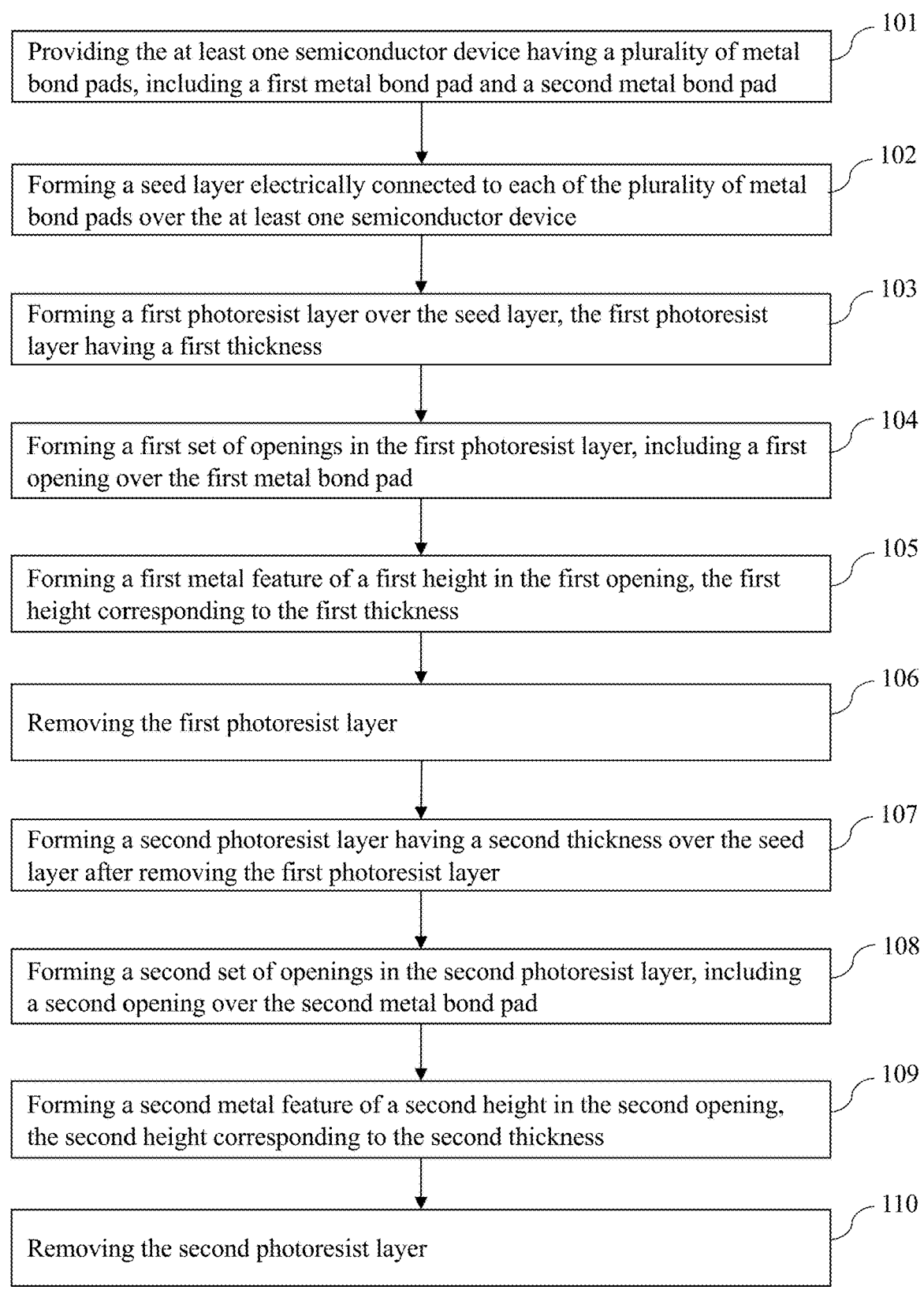
FIG. 1 is a schematic flow chart diagram of a method of forming a semiconductor package according to some embodiments.

The reference numerals include: semiconductor wafer (Semiconductor wafer)—20, first metal bond pad (The first metal bond pad)—31, second metal bond pad (The second metal bond pad)—32, Passivation layer (Passivation layer)—41, Polymer layer (Polymer layer)—42, Seed layer (Seed layer)—43, first photoresist layer (The first photoresist layer)—51, first mask layer (The first mask layer)—52, first opening (The first opening)—53, first under-bump metal (The first UBM)—61, second under-bump metal (The second UBM)—62, second photoresist layer (The second photoresist layer 611)—71, second mask layer (The first mask layer)—72, second opening (The second copper pillar)—73, copper pillar—611, 621, nickel layer (Ni layer)—612, 622, solder paste—613, 623.

DETAILED DESCRIPTION OF THE EMBODIMENTS

The embodiments and features of the embodiments may be combined with each other without conflict. Exemplary embodiments of the present disclosure will be described in more detail below with reference to the accompanying drawings. While exemplary embodiments of the present disclosure are shown in the drawings, it should be understood that the present disclosure may be embodied in various forms and should not be limited to the embodiments set forth herein. Rather, these embodiments are provided so that this disclosure will be thorough and complete, and will fully convey the scope of the disclosure to those skilled in the art.

The following disclosure provides various embodiments, or examples, for implementing various features of the invention. Specific examples of components and arrangements are described below to simplify the present disclosure. These are, of course, merely examples and are not intended to limit the invention. Further, the present invention may repeat reference numerals and/or characters in the various embodiments. This repetition is for the purpose of simplicity and clarity and does not in itself dictate a relationship between the various embodiments and/or configurations discussed.

It will be understood that terms such as "including" or "having," or the like, are intended to indicate the presence of the disclosed features, integers, steps, acts, components, parts, or combinations thereof, and are not intended to preclude the presence or addition of one or more other features, integers, steps, acts, components, parts, or combinations thereof.

Also, spatially relative terms, such as "below . . . ," "below . . . ," "lower," "above . . . ," "upper," and the like, may be used herein for ease of description to describe one element or component's relationship to another element (or other) component as illustrated. Spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly.

According to some embodiments, a technical solution is provided to solve the above technical problem. The technical problem generally relates to: (1) wafer bumps have been formed to have a uniform size; (2) although the pitch of bumps can be adjusted and changed, the size of bumps is usually fixed to a value, because large-sized bumps are usually plated faster than small-sized bumps in the electroplating process; (3) the height of the bumps is not uniform if different sized bumps are used; and (4) the yield of chips is reduced. In other words, the bump heights of different sized bumps on the same wafer are difficult to control. Embodiments of the present disclosure aim to address the problem of height control of different sized metal bumps.

A manufacturing process of the semiconductor package according to some embodiments is described below with reference to FIG. 1 and FIGS. 2 to 11.

Referring to FIG. 1, a method 100 of forming a semiconductor package may include steps 101-110:

In step 101, a semiconductor wafer is provided. In some embodiments, the semiconductor wafer 20 has at least one semiconductor device (not shown) formed thereon, and the at least one semiconductor device has a plurality of metal bond pads, including a first metal bond pad 31 and a second metal bond pad 32 shown in FIG. 2, located at respective positions on the semiconductor wafer 20.

Figure 2:
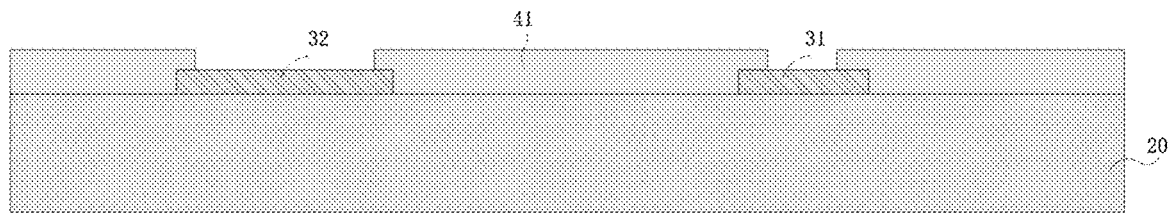
FIGS. 2 to 11 are respectively schematic structural cross-sectional views schematically illustrating respective intermediate stages of forming a semiconductor package according to some embodiments.

Referring to FIG. 2, in some embodiments, the metal bond pads may use materials including copper, aluminum, silver, gold, titanium, any combination thereof, or any other suitable material known in the art. The metal bond pads may have different sizes, such as a first metal bond pad 31 having a smaller size and a second metal bond pad 32 having a larger size. The two metal bond pads having different sizes may be disposed on the silicon wafer at a certain distance from each other, and the metal bond pads do not contact each other.

In some embodiments, the at least one semiconductor device (e.g., integrated circuit chip) may further include a patterned passivation layer 41 formed on the semiconductor wafer 20 and the plurality of metal bond pads. The passivation layer 41 has openings exposing at least a portion of each metal bond pad. In some embodiments, the passivation layer 41 covers a portion of the semiconductor wafer 20 and a portion of each metal bond pad. Referring to FIG. 2, a passivation layer 41 may be formed over the semiconductor wafer 20. The passivation layer 41 covering edge portions of the first and second metal bond pads 31 and 32, and a patterned opening formed in the passivation layer 41 exposing a central portion of each metal bond pad. Passivation layer 41 may be formed using any suitable material including SiO2, SiNx, phosphosilicate glass (PSG), or any suitable material known in the art that is suitable for passivation on a chip surface. According to some embodiments, the patterned passivation layer 41 forms an opening over each metal bond pad.

Figure 3:
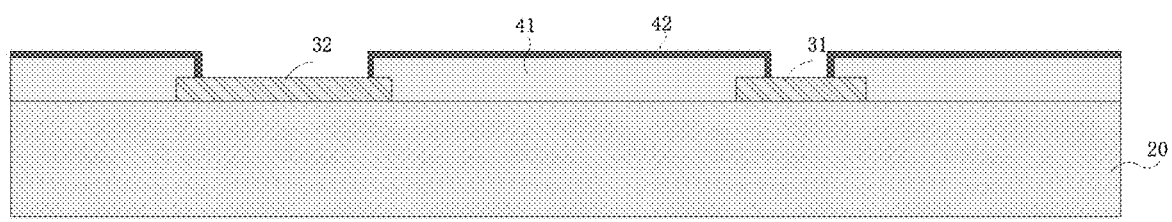

In some embodiments, a polymer layer 42 may be formed on the upper surface and the side surfaces of the passivation layer 41. The polymer layer 42 may include a photosensitive polymer formed of a material such as Polyimide (PI), Polybenzoxazole (PBO), benzocyclobutene (BCB), or any combination thereof, or any other suitable material known in the art. The polymer layer 42 may be coupled to the passivation layer 41 and in contact with the first and second metal bond pads 31, 32. The integrated circuit chip having the passivation layer 41 covering the polymer layer 42 has a very low leakage current, strong mechanical properties, and chemical resistance. Meanwhile, moisture can be effectively shielded, and the moisture resistance of the component is improved, so that the electrical performance of the chip is improved, and the production cost is reduced. Referring to FIG. 3, a polymer layer 42 may cover exposed surfaces of the passivation layer 41, and the polymer layer 42 extends into the opening of the passivation layer 41 formed at each metal bond pad, while keeping a central portion of each metal bond pad in an exposed state.

At step 102, a seed layer 43 is formed over the semiconductor device. In some embodiments, the seed layer 43 is electrically connected to each metal bond pad.

According to some embodiments of the present invention, seed layer 43 is a composite layer comprising a plurality of layers. For example, the seed layer 43 may include a titanium layer as a lower layer and a copper layer as an upper layer, thereby being electrically connected to each metal bond pad, respectively. According to an alternative embodiment, seed layer 43 may also be a single layer, for example, a copper layer. It will be appreciated that other suitable conductive materials may also be used for the seed layer 43.

Figure 4:
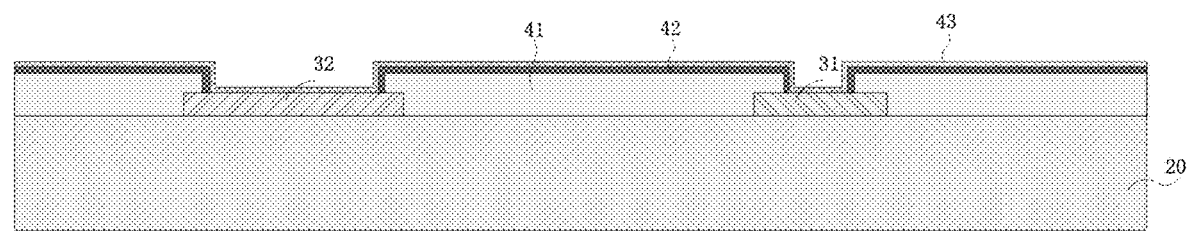

Referring to FIG. 4, a metallic material may be sputtered on exposed surfaces of the polymer layer 42 and the metal bond pads to form seed layer 43, which seed layer 43 may include a titanium layer as a lower layer and a copper layer as an upper layer. It should be appreciated that the exposed surface of seed layer 43 needs to be etched away in a subsequent packaging step to avoid circuit failure, as will be described in detail after step 110.

At step 103, a first photoresist layer 51 is formed over the seed layer 43.

At step 104, a first opening 53 is formed in the first photoresist layer 51 to expose the seed layer 43.

In some embodiments, the first opening 53 is located directly above at least a portion of the first metal bond pad 31.

Figure 5:
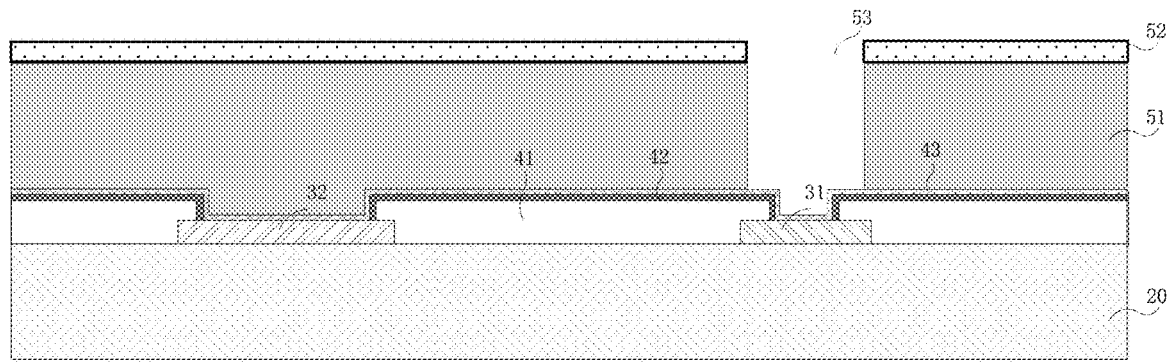

In some embodiments, referring to FIG. 5, a first photoresist layer 51 of a first thickness may be deposited over the seed layer 43, and a first mask layer 52 for patterning the first photoresist layer 51 may be placed over the first photoresist layer 51 to form a first opening 53. In particular, photoresist may be spun on the provided semiconductor wafer 20 and the seed layer 43 to form the first photoresist layer 51 of the first thickness, which may be determined according to a desired height dimension of a metal feature to be formed over the first metal bond pad 31. A first mask layer 52 is next placed over the first photoresist layer 51. The first mask layer 52 may be a photolithography mask including a transparent portion allowing light to pass therethrough and an opaque portion for blocking the light from passing therethrough. Afterwards, a light beam is projected on the first mask layer 52 to expose a portion of the first photoresist layer 51 directly under the transparent portion and not expose other portions of the first photoresist layer 51 directly under the opaque portion, thereby forming the first opening 53 after the exposed portion is cleaned off. The opening area of the first opening 53 may be determined according to a desired bottom size of an Under Bump metallization (UBM) for the first metal bond pad 31.

At step 105, a first metal feature of a first height is formed in the first opening 53.

Figure 6:
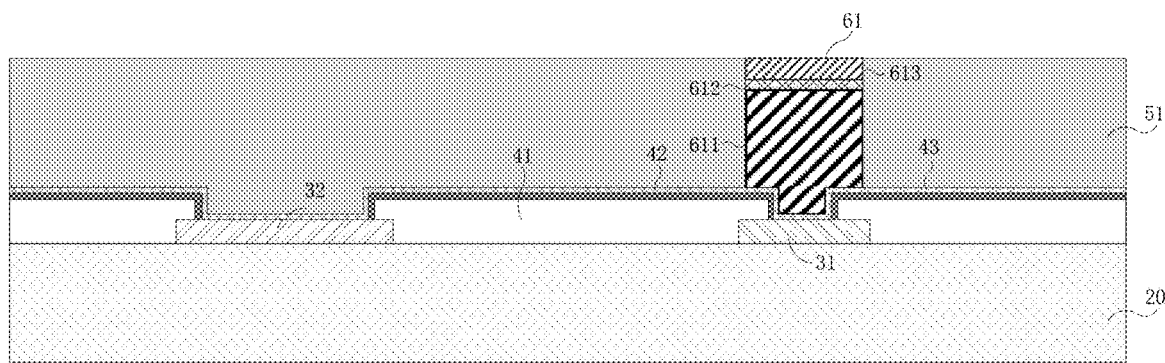

In some embodiments, referring to FIG. 6, the first metal feature may be a first Under-bump metal (UBM) 61. In conventional packaging techniques, such as Wafer Level Packaging (WLP), a redistribution layer (RDL) may be formed over the semiconductor wafer and electrically connected to active devices in the at least one semiconductor device. External input/output (I/O) pads (pads), such as solder balls may then be formed on Under Bump metallization (UBM) to electrically connect to the at least one semiconductor device through a redistribution layer (RDL). Optionally, the first metal feature may also be other metal interfaces for providing electrical interconnection of the chip. The present embodiment is described by taking the under-bump metallization as an example but is not limit to this example.

Referring to FIG. 6, a first under bump metallization 61 of a first height is formed in the first opening 53 above the seed layer 43, typically by an electroplating process, in which the first opening 53 is filled with a metal material to form the first under bump metallization 61. In some embodiments, the first height is substantially equal to the first thickness of the first photoresist layer 51 at the opening. The bottom of the first under-bump metallization 61 is electrically connected to the first metal bond pad 31 through the seed layer 43. According to some embodiments of the present invention, the step of forming the first under bump metal 61 may specifically include: forming a copper (Cu)-containing layer, such as a copper pillar 611, over the seed layer 43 and in the first opening 53 by electroplating, forming a nickel (Ni)-containing layer 612 over the copper (Cu)-containing layer, and forming a solder paste layer 613, such as a tin-silver compound layer (e.g., snag 1.8%) over the nickel (Ni)-containing layer 612.

Figure 7:
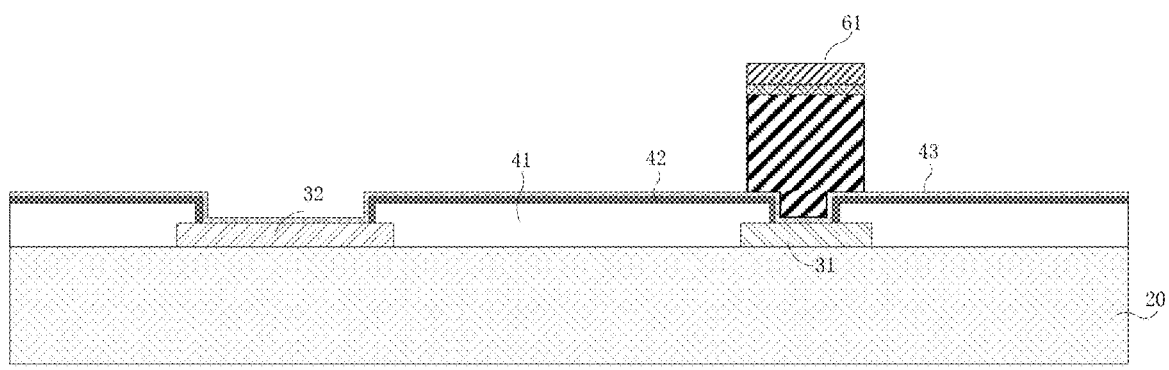

At step 106, the first photoresist layer 51 is removed; for example, the first photoresist layer 51 may be removed in a photoresist stripping process and the resulting structure is shown in FIG. 7.

After removing first photoresist layer 51, a second photoresist layer 71 is formed over seed layer 43 at step 107.

Figure 8:
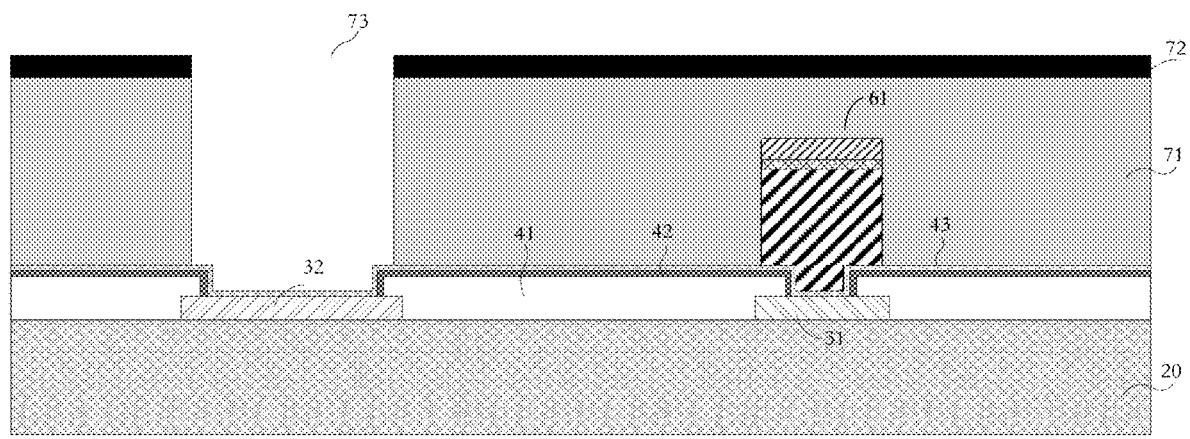

In some embodiments, referring to FIG. 8, after removing first photoresist layer 51, a second photoresist layer 71 is formed over seed layer 43 to completely cover the first metal feature, which in the illustration is the first under-bump metallization 61. In this case, the second photoresist layer 71 is higher than the first under bump metallization 61, and thus it is covered and protected by the photoresist.

At step 108, a second opening 73 is formed in second photoresist layer 71 to expose seed layer 43.

Wherein, referring to FIG. 8, the second opening 73 is located directly above at least a portion of the second metal bond pad 32.

In some embodiments, referring to FIG. 8, in a same or similar process as the formation of first opening 53, after removing first photoresist layer 51, a second photoresist layer 71 of a second thickness is deposited over seed layer 43, a second mask layer 72 is placed over the second photoresist layer 71 for patterning second photoresist layer 71, e.g., forming a second opening 73. Specifically, after removing first photoresist layer 51, photoresist is again spun on the seed layer 43 to form second photoresist layer 71 of a second thickness, which may be determined according to the desired height dimension of the second metal feature to be formed over the second metal bond pad 32. A second mask layer 72 is next placed over the second photoresist layer 71. The second mask layer 72 may also be a photolithographic mask including transparent portions that allow light to pass through and opaque portions for blocking the passage of light. The transparent portions may be disposed directly over at least portions of the second metal bond pads 32. Light beam is projected on the second mask layer 72 to expose portions of the second photoresist layer 71 directly under the transparent portions, i.e., the seed layer 43 substantially directly over the second metal bond pads 32, and unexposed portions of the second photoresist layer 71 directly under the opaque portions to form the second openings 73. The opening area of the second opening 73 can be freely determined depending on the desired size of the bottom of the second metal feature on the second metal bond pad 32.

A second metal feature of a second height is thus formed in the second opening 73 at step 109.

Figure 9:
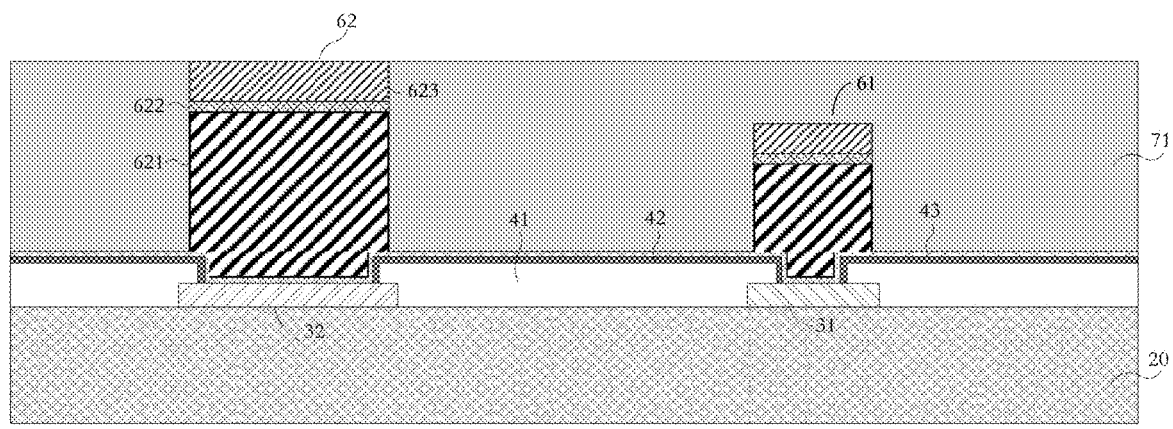

In some embodiments, referring to FIG. 9, the second metal feature may be a second under-bump metallization 62. Optionally, the second metal feature may also be other metal interfaces for providing electrical interconnection of the chip. The present embodiment is described by taking the under-bump metallization as an example but is not limit to this example.

Referring to FIG. 9, a same or similar process as the first under bump metallization 62 is followed by forming a second under bump metallization 62 of a second height above the seed layer and in the second opening 73, typically by performing an electroplating process to fill the second opening 73 with a metal material to form the second under bump metallization 62. In some embodiments, the second height is substantially equal to the second thickness of the second photoresist layer 71 at the third opening. The bottom of the second under-bump metallization 62 is electrically connected to the second metal bond pad 32 through the seed layer 43. According to some embodiments of the present invention, the step of forming the second under bump metal 62 may specifically include: forming a copper (Cu)-containing layer 621, which may be, for example, a copper pillar, over the seed layer 43 and in the second opening 73 by electroplating, forming a nickel (Ni)-containing layer 622 over the copper (Cu)-containing layer 621, and forming a solder paste layer 613, which may be, for example, a tin-silver compound layer (e.g., snag 1.8%), such as snag 1.8%, over the nickel (Ni)-containing layer 622.

Figure 10:
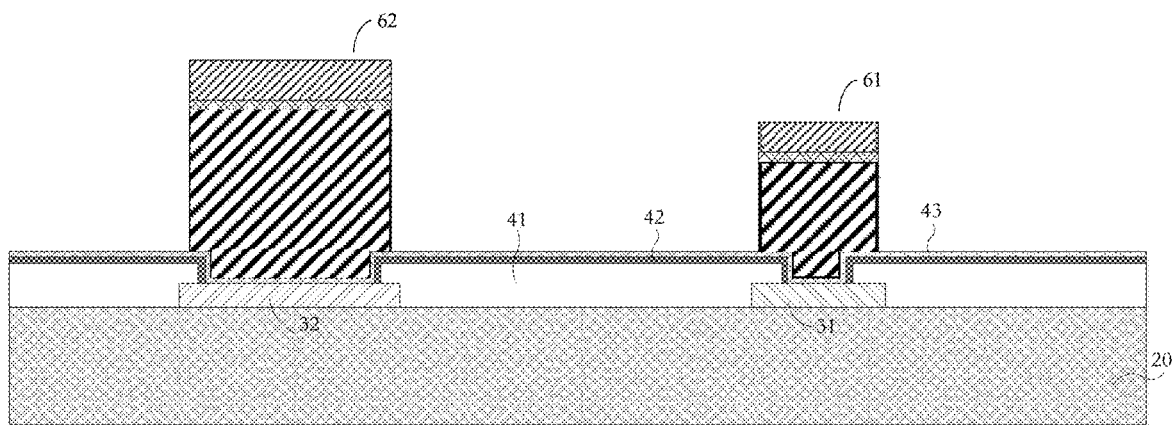

In step 110, the second photoresist layer 71 is removed. For example, the second photoresist layer 71 may be removed in a photoresist stripping process, similar to the removal process for removing the first photoresist layer 51. The resulting structure is shown in FIG. 10.

Figure 11:
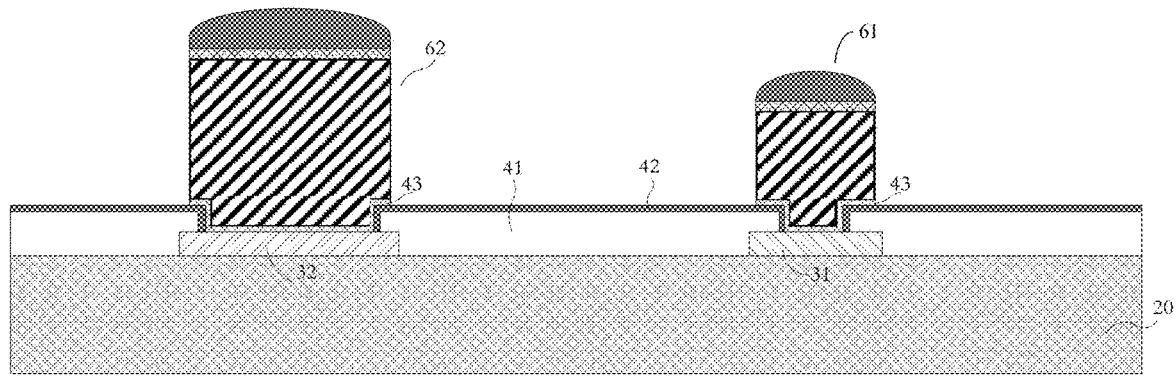

In some embodiments, referring to FIG. 11, the exposed portions of seed layer 43 previously covered by the photoresist is next removed by etching, while the unexposed portions of seed layer 43 covered by first under-bump metallization 61 and second under-bump metallization 62 remain.

The solder pastes 613 and 623 previously dispensed on top of the metal bond pad are re-melted by a reflow soldering process, resulting in the solder bumps shown in FIG. 11 due to the liquid surface tension of the melted material.

It is understood that if the second metal bond pad 32 with a larger size is desired to have a lower metal feature, the above steps may be reversed, that is, the mask opening at the second metal bond pad 32 is firmed in the photoresist 51 to form the second metal feature (in the illustration, the second under bump metal 62) on the second metal bond pad 32, and then the mask opening at the first metal bond pad 31 is formed in the photoresist 71 to form the first metal feature (in the illustration, the first under bump metal 61) on the first metal bond pad 31, which will not be described again.

The above-described embodiments describe in detail the case of a single first metal feature and second metal feature. It is to be understood that, based on the spirit of the packaging method described above, a semiconductor package including a plurality of first metal features and second metal features having different sizes and heights can be packaged. In other embodiments, more than two metal features with different sizes and heights can be formed, which are not described in detail herein.

According to various aspects of the above embodiments, by employing a new package structure design and a unique process flow, a variety of wafer bumps of different sizes and controlled bump heights can be formed on a wafer, which is very valuable for the integration of ASIC bare chips and chiplets using high density interconnect routing in the same package.

The invention also provides a package which is manufactured and formed by adopting the method of the embodiment.

Referring to FIG. 11, in some embodiments, a semiconductor package comprises at least one semiconductor device including a plurality of metal bond pads and a plurality of metal features formed on respective ones of the plurality of metal bond pads. The plurality of metal bond pads including a first bond pad and a second bond pad. The plurality of metal features including a first metal feature of a first height and a second metal feature of a second height different from the first height. Each of the plurality of metal features includes a seed layer formed on a respective metal bond pad and electrically connected to the respective metal bond pad, an under-bump metallization (UMB) layer formed over the seed layer, and a solder bump formed over the UMB layer.

In some embodiments, the at least one semiconductor device further includes a passivation layer formed over the plurality of metal bond pads. In some embodiments, a patterned opening in the passivation layer exposes at least a portion of each metal bond pad; and the seed layer covers at least the exposed surface of each metal bond pad.

In some embodiments, the at least one semiconductor device further includes a polymer layer formed on a surface of the passivation layer.

In some embodiments, the thicknesses of the UMB layers in the first and second metal features are different.

In some embodiments, the first height is less than the second height.

While the spirit and principles of the invention have been described with reference to several particular embodiments, it is to be understood that the invention is not limited to the disclosed embodiments, nor is the division of aspects, which is for convenience only as the features in such aspects may not be combined to benefit. The invention is intended to cover various modifications and equivalent arrangements included within the spirit and scope of the appended claims.

What is claimed is:

1. A method of forming a semiconductor package, comprising:

providing a semiconductor wafer having at least one semiconductor device formed thereon, the at least one semiconductor device including a plurality of metal bond pads positioned on the semiconductor wafer, the plurality of metal bond pads including a first metal bond pad and a second metal bond pad;

forming a seed layer over the at least one semiconductor device, the seed layer being electrically connected to each of the plurality of metal bond pads;

forming a first photoresist layer over the seed layer, the first photoresist layer having a first thickness;

forming a first set of openings in the first photoresist layer, the first set of openings including a first opening exposing a first portion of the seed layer directly over at least a portion of the first metal bond pad of the plurality of metal bond pads;

forming a first metal feature of a first height in the first opening, the first height corresponding to the first thickness;

removing the first photoresist layer;

forming a second photoresist layer over the seed layer after removing the first photoresist layer, the second photoresist layer having a second thickness different from the first thickness;

forming a second set of openings in the second photoresist layer, the second set of openings including a second opening exposing a second portion of the seed layer directly over at least a portion of the second metal bond pad of the plurality of metal bond pads;

forming a second metal feature of a second height in the second opening, the second height corresponding to the second thickness; and removing the second photoresist layer;

wherein the second metal bond pad is larger in size than the first metal bond pad, and the second height is greater than the first height; and wherein the first metal feature and the second metal feature are both under-bump metallization features.

2. The method of claim 1, further comprising, before forming the seed layer, forming a patterned passivation layer over the semiconductor wafer and the plurality of metal bond pads, the passivation layer exposing at least a portion of each of the metal bond pads, wherein the seed layer subsequently covers exposed portion of each of the metal bond pads.

3. The method of claim 2, wherein after forming the patterned passivation layer, the method further comprises: forming a polymer layer on the passivation layer.

4. The method of claim 3, wherein forming the seed layer comprises:
sputtering a metallic material on exposed surfaces of the polymer layer and exposed portions of the plurality of metal bond pads to form the seed layer.

5. The method of claim 1, further comprising, after removing the second photoresist layer, etching away exposed portions of the seed layer.

6. The method of claim 1, wherein:
forming the first photoresist layer over the seed layer includes forming the first photoresist layer of the first thickness over the seed layer;
forming the first set of openings in the first photoresist layer includes placing a first mask layer over the first photoresist layer for patterning the first photoresist layer to form the first set of openings;
forming a second photoresist layer over the seed layer includes, after removing the first photoresist layer, forming the second photoresist layer of the second thickness over the seed layer; and
forming the second set of openings in the second photoresist layer includes placing a second mask layer over the second photoresist layer for patterning the second photoresist layer to form the second set of openings.

7. The method of claim 1, wherein forming the second photoresist layer over the seed layer includes, after the removing the first photoresist layer, forming the second photoresist layer over the seed layer to completely cover the first metal feature.

8. A semiconductor package made using at least the method of claim 1.

9. The method of claim 1, wherein:
forming the first metal feature comprises forming a first copper (Cu) pillar over the seed layer in the first opening by electroplating, and forming a first nickel (Ni)-containing layer over the first copper (Cu) pillar; and
forming the second metal feature comprises forming a second copper (Cu) pillar over the seed layer in the second opening by electroplating, and forming a second nickel (Ni)-containing layer over the second copper (Cu) pillar;
wherein the second copper (Cu) pillar is taller than the first copper (Cu) pillar.

10. The method of claim 9, further comprising:
forming a first solder paste layer including a tin-silver compound over the first nickel (Ni)-containing layer;
forming a second solder paste layer including a tin-silver compound over the second nickel (Ni)-containing layer; and
performing a reflow process to turn the first and second solder paste layers into first and second solder bumps.

11. A semiconductor package, comprising:
at least one semiconductor device having a plurality of metal bond pad and a plurality of metal features formed on respective ones of the plurality of metal bond pads, the plurality of metal bond pads including a first metal bond pad and a second metal bond pad, the plurality of metal features including a first metal feature of a first height formed on the first metal bond pad and a second metal feature of a second height formed on the second metal bond pad, each of the plurality of metal features is an under-bump metallization feature;
wherein the second metal bond pad is larger in size than the first metal bond pad, and the second height is greater than the first height; and wherein:
the first metal feature includes a first seed layer formed on the first metal bond pad and electrically connected to the first metal bond pad, and a first under-bump metallization (UMB) layer formed over the first seed layer;
the second metal feature includes a second seed layer formed on the second metal bond pad and electrically connected to the second metal bond pad, and a second under-bump metallization (UMB) layer formed over the second seed layer; and
the second under-bump metallization layer is thicker than the first under-bump metallization layer;
the semiconductor package further comprises a first solder bump formed over the first UMB layer and a second solder bump formed over the first UMB layer.

12. The semiconductor package of claim 11, wherein
the first UMB layer includes a first copper pillar and a first nickel-containing layer formed over the first copper pillar;
the second UMB layer includes a second copper pillar and a second nickel-containing layer formed over the second copper pillar; and
the second copper pillar is taller than the first copper pillar;
the semiconductor package further comprises a first solder paste layer formed over the first nickel-containing layer and a second solder paste layer formed over the second nickel-containing layer.

13. The semiconductor package of claim 11, further comprising:
- a passivation layer formed over the semiconductor wafer and the a plurality of metal bond pads, the passivation layer having openings exposing at least a portion of each of the metal bond pads;
- wherein the at least a portion of each of the metal bond pads is covered by a corresponding seed layer.

14. The semiconductor package of claim 13, further comprising: a polymer layer formed on the passivation layer.

* * * * *